United States Patent
Laskaris et al.

(10) Patent No.: US 6,246,308 B1
(45) Date of Patent: Jun. 12, 2001

(54) SUPERCONDUCTIVE MAGNET INCLUDING A CRYOCOOLER COLDHEAD

(75) Inventors: Evangelos Trifon Laskaris, Niskayuna; Paul Shadforth Thompson, Stephentown; Yu Wang, Clifton Park, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/716,060

(22) Filed: Nov. 20, 2000

Related U.S. Application Data

(62) Division of application No. 09/436,830, filed on Nov. 9, 1999, now Pat. No. 6,181,228.

(51) Int. Cl.⁷ ............... H01F 6/00; F25B 19/00
(52) U.S. Cl. .............. 335/216; 505/893; 62/51.1; 324/319; 335/300
(58) Field of Search .................. 335/216, 297, 335/300; 505/892, 893, 894; 324/318, 319, 320; 62/51.1

(56) References Cited

U.S. PATENT DOCUMENTS 5,966,944 * 1/2000 Inoue et al. ............. 62/51.1
6,011,456 * 1/2000 Eckels et al. ............. 335/300

* cited by examiner

Primary Examiner—Ramon M. Barrera
(74) Attorney, Agent, or Firm—Donald S. Ingraham; Douglas E. Stoner

(57) ABSTRACT

A magnet, such as an open or closed magnet, has a first assembly with at least one superconductive main coil and with a first vacuum enclosure enclosing the main coil(s). A first cryocooler coldhead has a rigid first housing and is generally vertically aligned. A first flexible bellows is vertically aligned, has a first end attached to the first housing of the first cryocooler coldhead and has a second end attached to the first vacuum enclosure of the first assembly.

10 Claims, 4 Drawing Sheets

SUPERCONDUCTIVE MAGNET INCLUDING A CRYOCOOLER COLDHEAD

This application is a division of application Ser. No. 09/436,830, filed Nov. 9, 1999 now U.S. Pat. No. 6,181,228, which is hereby incorporated by reference in its entirety.

BACKGROUND OF THE INVENTION

The present invention relates generally to superconductive magnets, and more particularly to a superconductive magnet having a cryocooler coldhead.

Magnets include resistive and superconductive magnets which are part of a magnetic resonance imaging (MRI) system used in various applications such as medical diagnostics. Known superconductive magnets include liquid-helium-cooled, cryocooler-cooled, and hybrid-cooled superconductive magnets. Typically, the superconductive coil assembly includes a superconductive main coil surrounded by a thermal shield surrounded by a vacuum enclosure. A cryocooler-cooled magnet typically also includes a cryocooler coldhead externally mounted to the vacuum enclosure, having its first stage in solid conduction thermal contact with the thermal shield, and having its second stage in solid conduction thermal contact with the superconductive main coil. A liquid-helium-cooled magnet typically also includes a liquid-helium vessel surrounding the superconductive main coil with the thermal shield surrounding the liquid-helium vessel. A hybrid-cooled magnet uses both liquid helium (or other liquid or gaseous cryogen) and a cryocooler coldhead, and includes designs wherein the first stage of the cryocooler coldhead is in solid conduction thermal contact with the thermal shield and wherein the second stage of the cryocooler coldhead penetrates the liquid-helium vessel to recondense "boiled-off" helium.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a constant magnetic field of high uniformity within a typically spherical imaging volume centered within the magnet's bore where the object to be imaged is placed.

Open magnets, including "C" shape and support-post magnets, typically employ two spaced-apart coil assemblies with the space between the assemblies containing the imaging volume and allowing for access by medical personnel for surgery or other medical procedures during magnetic resonance imaging. The open space helps the patient overcome any feelings of claustrophobia that may be experienced in a closed magnet design.

The sharpness of an MRI image depends, in part, on the magnetic field in the imaging volume being time-constant and highly uniform, such magnetic field suffering time and spatial deformation caused by vibrations imparted to the coil assemblies by the presence of a cryocooler coldhead. What is needed is a design for a superconductive magnet having a cryocooler coldhead which reduces vibrations imparted to the coil assemblies by the cryocooler coldhead and hence which improves the sharpness of an MRI image.

BRIEF SUMMARY OF THE INVENTION

In a first expression of an embodiment of the invention, a magnet includes a first assembly, a first cryocooler coldhead, and a first bellows. The first assembly has a longitudinally-extending first axis, at least one superconductive main coil, and a first vacuum enclosure. The at least one superconductive main coil is generally coaxially aligned with the first axis, and the first vacuum enclosure encloses the at least one superconductive main coil of the first assembly. The first cryocooler coldhead has a first central axis and a rigid first housing, wherein the first central axis is generally vertically aligned. The first bellows has a first bellows axis and first and second ends. The first bellows axis is generally vertically aligned, and the first bellows is flexible along the first bellows axis. The first end of the first bellows is hermetically attached to the first housing of the first cryocooler coldhead, and the second end of the first bellows is hermetically attached to the first vacuum enclosure of the first assembly.

In a second expression of an embodiment of the invention, an open magnet includes first and second assemblies, at least one nonmagnetizable support member, a first cryocooler coldhead, and a first bellows. The first assembly has a longitudinally-extending and generally-vertically-aligned first axis, at least one superconductive main coil, a first vacuum enclosure, and a first magnet pole piece. The at least one superconductive main coil is generally coaxially aligned with the first axis. The first vacuum enclosure encloses the at least one superconductive main coil of the first assembly and surrounds a first bore. The first magnet pole piece is generally coaxially aligned with the first axis and is positioned inside the first bore and outside the first vacuum enclosure. The first cryocooler coldhead has a first central axis and a rigid first housing, wherein the first central axis is generally vertically aligned. The first bellows has a first bellows axis and first and second ends. The first bellows axis is generally vertically aligned, and the first bellows is flexible along the first bellows axis. The first end of the first bellows is hermetically attached to the first housing of the first cryocooler coldhead, and the second end of the first bellows is hermetically attached to the first vacuum enclosure of the first assembly. The second assembly is longitudinally spaced apart from, and is positioned vertically below, the first assembly. The second assembly includes a longitudinally-extending second axis which is generally coaxially aligned with the first axis, at least one superconductive main coil, a second vacuum enclosure, and a second magnet pole piece. The at least one superconductive main coil is generally coaxially aligned with the second axis. The second vacuum enclosure encloses the at least one superconductive main coil of the second assembly and surrounds a second bore. The second magnet pole piece is generally coaxially aligned with the second axis and is positioned inside the second bore and outside the second vacuum enclosure. The at least one nonmagnetizable support member has a first end attached to the first magnet pole piece and has a second end attached to the second magnet pole piece.

Several benefits and advantages are derived from the invention. Applicants conducted an experiment wherein the cryocooler coldhead was vertically aligned, was flexibly attached by a flexible bellows to the vacuum enclosure of a superconductive magnet, and was rigidly attached to the support ceiling of the room by a rigid coldhead support. Applicants found more than a hundred times reduction in vibration of the vacuum enclosure caused by the cryocooler coldhead compared to having the cryocooler coldhead rigidly mounted to the vacuum enclosure. Engineering calculations show improved vibration reduction by having the central axis of the cryocooler coldhead, the first bellows axis, and the lengthwise axis of the rigid coldhead support (which attaches the cryocooler coldhead to the support ceiling or floor) all be generally coincident (and all be generally vertically aligned). Engineering analysis shows improved vibration reduction over a horizontally-aligned cryocooler coldhead. Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation. It is noted that, in an open magnet, when the support member(s) provide a "clam-shell" support for the assemblies, the superconductive coils of such assemblies are subject to a significant "clam-shell" vibration from the cryocooler coldhead(s) which is likened to the partial closing and opening of a clam shell. It is noted that a "clam-shell" support is provided by having only two support members, especially when the two support members are not diametrically aligned. Such clam-shell support is a very open support providing ease of patient table access to the imaging volume and providing ease of patient positioning within the imaging volume.

DETAILED DESCRIPTION OF THE INVENTION

Figure 1:
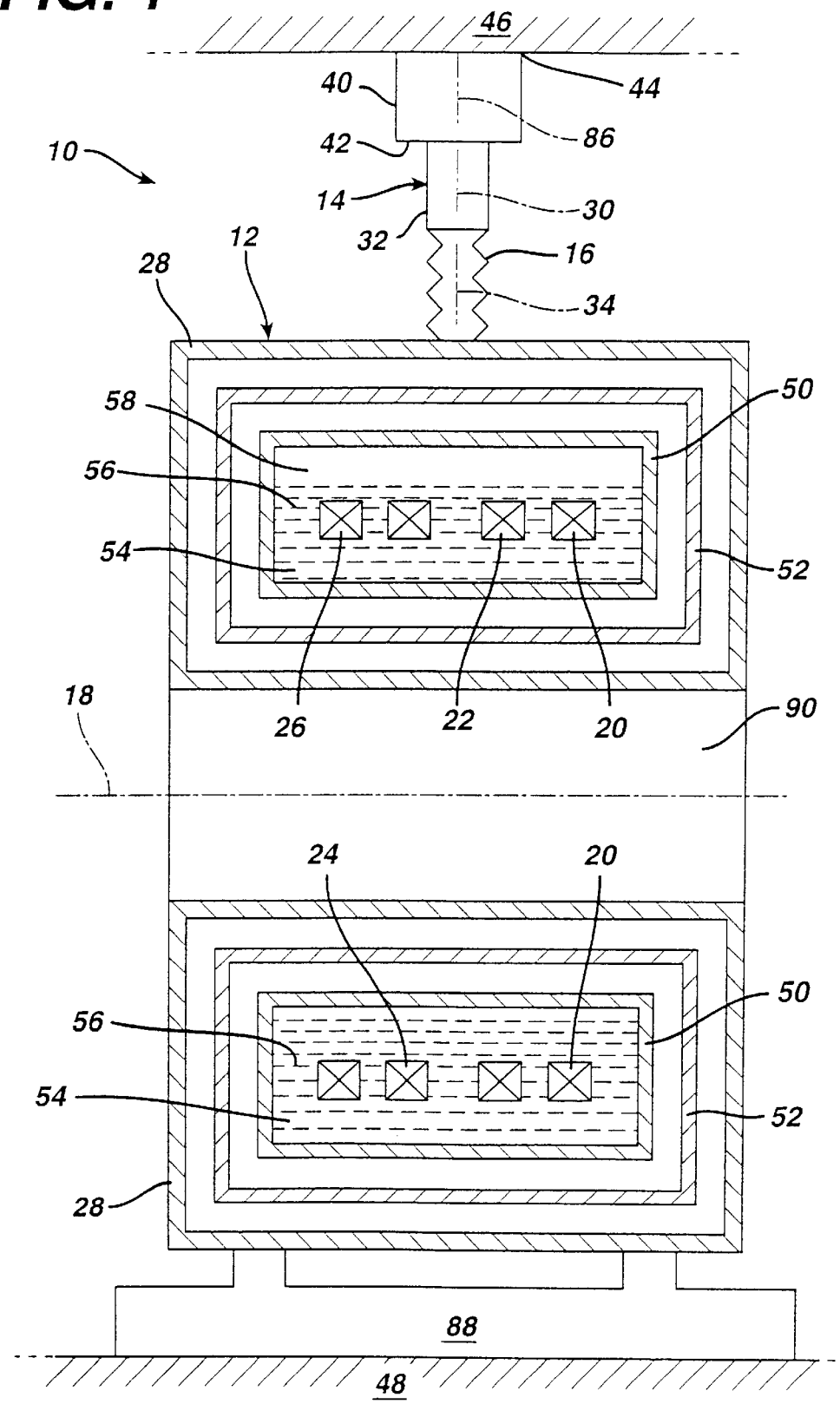
FIG. 1 is a schematic, cross-sectional view of a first embodiment of a magnet of the invention, wherein the magnet is a closed magnet which is generally horizontally aligned.
Figure 2:
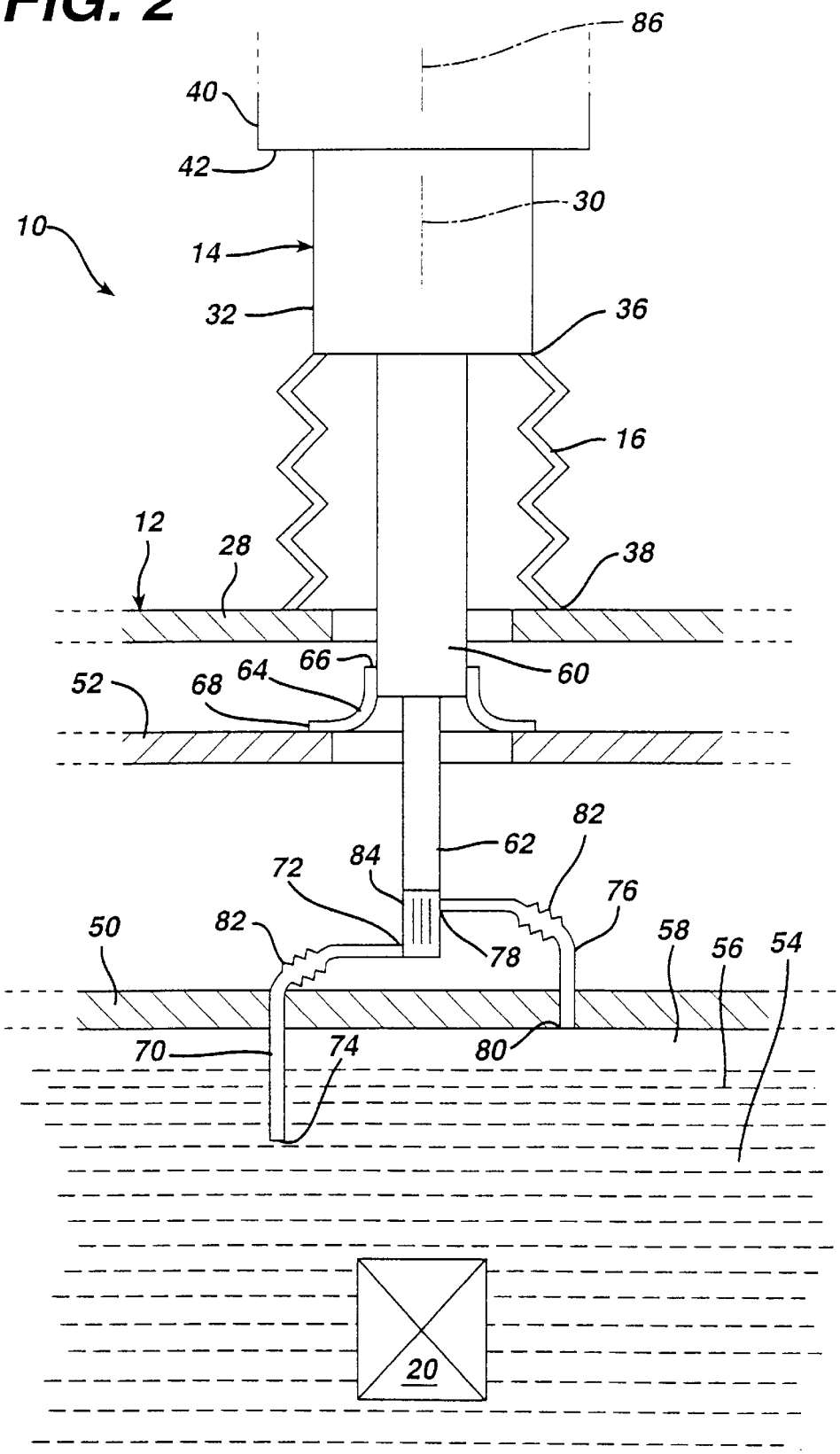
FIG. 2 is an enlarged view of an upper portion of the magnet of FIG. 1 showing details of the cryocooler coldhead and their relationship to other components of the magnet.

Referring now to the drawings, wherein like numerals represent like elements throughout, FIGS. 1–2 show a first embodiment of the present invention. In a first expression of a first embodiment of the invention shown in FIGS. 1–2, a magnet 10 includes a first assembly 12, a first cryocooler coldhead 14, and a first bellows 16. The first assembly 12 has a longitudinally-extending first axis 18, at least one superconductive main coil 20, 22, 24, and 26, and a first vacuum enclosure 28. The at least one superconductive main coil 20–26 is generally coaxially aligned with the first axis 18 and carries a first main electric current in a first direction. The first direction is defined to be either a clockwise or a counterclockwise circumferential direction about the first axis 18 with any slight longitudinal component of current direction being ignored. The first vacuum enclosure 28 encloses the at least one superconductive main coil 20–26 of the first assembly 12. The first cryocooler coldhead 14 has a first central axis 30 (which is the axis of the coldhead cylinder and displacer piston, not shown) and has a rigid first housing 32, wherein the first central axis 30 is generally vertically aligned. By "rigid" is broadly meant more rigid than the below-described bellows, and, in one example, by "rigid" is more narrowly meant manually rigid, wherein the first housing 32 cannot be flexed by the hands of an average-strengthened adult person. By "generally-vertically-aligned" is meant vertically aligned plus or minus twenty degrees. The first bellows 16 has a first bellows axis 34 and first and second ends 36 and 38. The first bellows axis 34 is generally vertically aligned, and the first bellows 16 is flexible along the first bellows axis 34. By "flexible" is broadly meant more flexible than the above-described first housing 32, and, in one example, by "flexible" is more narrowly meant manually flexible, wherein the first bellows 16 can be flexed like an accordion by the hands of an average-strengthened adult person. It is seen, from FIGS. 1 and 2, that the first and second ends 36 and 38 of the first bellows 16 are the axial ends of the first bellows 16 along the direction of the first bellows axis 34. The first end 36 of the first bellows 16 is hermetically attached to the first housing 32 of the first cryocooler coldhead 14, and the second end 38 of the first bellows 16 is hermetically attached to the first vacuum enclosure 28 of the first assembly 12.

In one design, the magnet 10 includes a rigid and generally-vertically-aligned first coldhead support 40. The first coldhead support 40 has a first vertical end 42 attached to the first housing 32 of the first cryocooler coldhead 14. The first coldhead support 40 has a second vertical end 44 either attached to a support ceiling 46 (an example of such attachment shown in FIG. 1) or supported by a floor 48 (an example of such attachment shown in the below-described open magnet of the second embodiment of the invention). The first housing 32 of the first cryocooler coldhead 14 derives no weight25 bearing support from the first vacuum enclosure 28 of the first assembly 12. The first cryocooler coldhead 14 is part of a first cryocooler (not shown), and there are other components (not shown) of the first cryocooler which are connected to the first cryocooler coldhead 14 such as a compressor motor. In one design, such other components are likewise attached to the support ceiling or supported by the floor, without deriving any weight-bearing support from the first vacuum enclosure.

In one construction, the first assembly 12 includes a first cryogenic vessel 50 surrounding the at least one superconductive main coil 2026 and includes a first thermal shield 52 generally surrounding the first cryogenic vessel 50, wherein the first thermal shield 52 is surrounded by the first vacuum enclosure 28. The first cryogenic vessel 50 contains a first cryogenic fluid 54 including a liquid portion 56 and a boiled-off gaseous portion 58. In another construction, not shown, there would be no cryogenic vessel, and cooling of the superconductive coils would be accomplished solely by one or more cryocooler coldheads, as can be appreciated by the artisan.

In one enablement, the first cryocooler coldhead 14 is a two-stage cryocooler coldhead and includes a first stage 60 and a second stage 62 which is colder than the first stage 60. In this enablement, the magnet 10 also includes a flexible, thermally-conductive strip 64 having a first end 66 in thermal contact with the first stage 60 of the first cryocooler coldhead 14 and having a second end 68 in thermal contact with the first thermal shield 52 of the first assembly 12. In one example, the flexible, thermally-conductive strip 64 comprises a braided, OFC (oxygen-free-copper) copper strip. Here, the magnet 10 also includes a first flexible tube 70 having a first end 72 in thermal contact with the second stage 62 of the first cryocooler coldhead 14 and having a second end 74 in physical contact with the liquid portion 56 of the first cryogenic fluid 54. The magnet 10 further includes a second flexible tube 76 having a first end 78 in thermal contact with the second stage 62 of the first cryocooler coldhead 14 and having a second end 80 in physical contact with the gaseous portion 58 of the first cryogenic fluid 54. It is noted that the first end 78 of the second flexible tube 76 is disposed vertically above the first end 72 of the first flexible tube 70. In one example, the first and second flexible tubes 70 and 76 comprise nonmagnetic stainless steel tubes each having a bellows section 82. In one construction, the vertically lower end of the second stage 62 of the first cryocooler coldhead 14 contains a condenser 84 to which the first ends 72 and 78 of the first and second flexible tubes 70 and 76 are brought in thermal contact. In one design (not shown), the first housing 32 is a sleeve which also surrounds the first and second stages 60 and 62 wherein the first cryocooler coldhead 14 can be replaced without loss of vacuum, such sleeve arrangement being known to those skilled in the art.

In one example, the first central axis 30 of the first cryocooler coldhead 14 and the first bellows axis 34 of the first bellows 16 are generally coincident. In this example, the first coldhead support 40 has a length and has a lengthwise axis 86. The lengthwise axis 86 of the first coldhead support 40 is generally coincident with the first central axis 30 of the first cryocooler coldhead 14 and the first bellows axis 34 of the first bellows 16.

In one application, the first axis 18 of the first assembly 12 is generally horizontally aligned, the first vacuum enclosure 28 is supported by a floor mount 88 placed on the floor 48, and the first coldhead support 40 is attached to the support ceiling 46, wherein the first cryocooler coldhead 14 derives no weight-bearing support from the first vacuum enclosure 28 of the first assembly 12, as shown in FIG. 1. By "generally horizontally aligned" is meant horizontally aligned plus or minus twenty degrees. It is pointed out that the first coldhead support 40 typically is much longer than it appears in FIG. 1. In this application, the magnet 10 is a closed magnet having only one assembly (i.e., the first assembly 12), and the object to be imaged (not shown) would be placed in the first bore 90 of the first vacuum enclosure 28. In another application (not shown) the magnet 10, as broadly described in the previous first paragraph of the Detailed Description of the Invention, is a closed magnet having a closed bore such as a horizontally-aligned table magnet or a vertically-aligned wall magnet, as can be appreciated by the artisan. In a further application the magnet 10, as broadly described in the previous first paragraph of the Detailed Description of the Invention, is an open magnet having a second assembly, wherein the first and second assemblies of the open magnet have open or closed bores and wherein the open magnet is horizontally or vertically aligned. It is noted that these applications are not limited to a single cryocooler coldhead.

Figure 4:
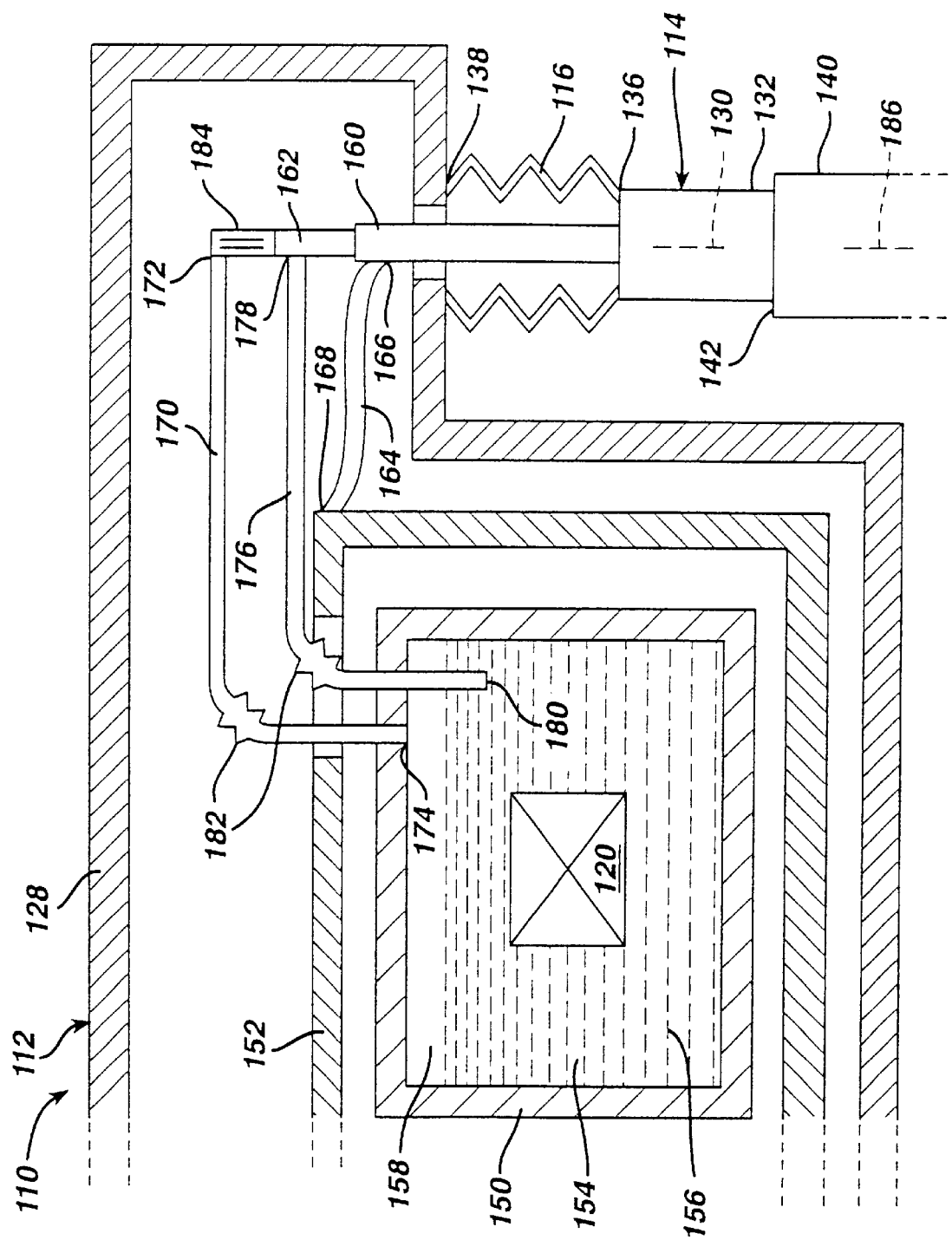
FIG. 4, is an enlarged view of an upper right-hand portion of the magnet of FIG. 3 showing details of the cryocooler coldhead and their relationship to other components of the magnet.

In a first expression of a second embodiment of the invention shown in FIGS. 4–5, an open magnet 110 includes a first assembly 112, a second assembly 212, a first cryocooler coldhead 114, a first bellows 116, and at least one nonmagnetizable support member 192 and 292. A support member is said to be a nonmagnetizable support member if it includes at least a nonmagnetizable portion which blocks having a magnetizable path between its ends. Such nonmagnetizable portion would have a relative permeability of generally unity. Examples of nonmagnetizable materials include aluminum, copper, nonmagnetic stainless steel, plastic, wood, etc. The first assembly 112 has a longitudinally-extending and generally-vertically-aligned first axis 118, at least one superconductive main coil 120, a first vacuum enclosure 128, and a first magnet pole piece 194. The at least one superconductive main coil 120 is generally coaxially aligned with the first axis 118 and carries a first main electric current in a first direction. The first vacuum enclosure 128 encloses the at least one superconductive main coil 120 of the first assembly 112 and surrounds a first bore 190. The first magnet pole piece 194 is generally coaxially aligned with the first axis 118 and is disposed inside the first bore 190 and outside the first vacuum enclosure 128. The first cryocooler coldhead 114 has a first central axis 130 (which is the axis of the coldhead cylinder and displacer piston, not shown) and has a rigid first housing 132, wherein the first central axis 130 is generally vertically aligned. The first bellows 116 has a first bellows axis 134 and first and second ends 136 and 138. The first bellows axis 134 is generally vertically aligned, and the first bellows 116 is flexible along the first bellows axis 134. The first end 136 of the first bellows 116 is hermetically attached to the first housing 132 of the first cryocooler coldhead 114, and the second end 138 of the first bellows 116 is hermetically attached to the first vacuum enclosure 128 of the first assembly 112. The second assembly 212 is longitudinally spaced apart from, and disposed generally vertically below, the first assembly 112. The second assembly 212 has a longitudinally-extending second axis 218 generally coaxially aligned with the first axis 118, at least one superconductive main coil 220, a second vacuum enclosure 228, and a second magnet pole piece 294. The at least one superconductive main coil 220 is generally coaxially aligned with the second axis 218 and carries a first main electric current in the previously-described first direction. The second vacuum enclosure 228 encloses the at least one superconductive main coil 220 of the second assembly 212 and surrounds a second bore 290. The second magnet pole piece 294 is generally coaxially aligned with the second axis 218 and is disposed inside the second bore 290 and outside the second vacuum enclosure 228. The at least one nonmagnetizable support member 192 and 292 has a first end 196 and 296 attached to the first magnet pole piece 194 and has a second end 198 and 298 attached to the second magnet pole piece 294.

In one design, the open magnet 1 10 includes a rigid and generally-vertically-aligned first coldhead support 140. The first coldhead support 140 has a first vertical end 142 attached to the first housing 132 of the first cryocooler coldhead 114. The first coldhead support 140 has a second vertical end 144 either attached to a support ceiling (an example of such attachment shown in the above-described magnet 10 of the first embodiment of the invention) or supported by a floor 148 (an example of such attachment shown in FIG. 3). The first housing 132 of the first cryocooler coldhead 114 derives no weight-bearing support from the first vacuum enclosure 128 of the first assembly 112 or from the second vacuum enclosure 228 of the second assembly 212 or from the at least one nonmagnetizable support member 192 and 292. The first cryocooler coldhead 114 is part of a first cryocooler (not shown), and there are other components (not shown) of the first cryocooler which are connected to the first cryocooler coldhead 114 such as a compressor motor. In one design, such other components are likewise attached to the support ceiling or supported by the floor, without deriving any weight-bearing support from the first or second vacuum enclosure or from the support member(s).

In one construction, the first assembly 112 includes a first cryogenic vessel 150 surrounding the at least one superconductive main coil 120 and includes a first thermal shield 152 generally surrounding the first cryogenic vessel 150, wherein the first thermal shield 152 is surrounded by the first vacuum enclosure 128. The first cryogenic vessel 150 contains a first cryogenic fluid 154 including a liquid portion 156 and a boiled-off gaseous portion 158. In another construction, not shown, there would be no cryogenic vessel, and cooling of the superconductive coils would be accomplished solely by one or more cryocooler coldheads, as can be appreciated by the artisan.

In one enablement, the first cryocooler coldhead 114 is a two-stage cryocooler coldhead and includes a first stage 160 and a second stage 162 which is colder than the first stage 160. In this enablement, the magnet 110 also includes a flexible, thermally-conductive strip 164 having a first end 166 in thermal contact with the first stage 160 of the first cryocooler coldhead 114 and having a second end 168 in thermal contact with the first thermal shield 152 of the first assembly 112. In one example, the flexible, thermally-conductive strip 164 comprises a braided, OFC copper strip. Here, the open magnet 110 also includes a first flexible tube 170 having a first end 172 in thermal contact with the second stage 162 of the first cryocooler coldhead 114 and having a second end 174 in physical contact with the gaseous portion 158 of the first cryogenic fluid 154. The open magnet 110 further includes a second flexible tube 176 having a first end 178 in thermal contact with the second stage 162 of the first cryocooler coldhead 114 and having a second end 180 in physical contact with the liquid portion 156 of the first cryogenic fluid 154. It is noted that the first end 178 of the second flexible tube 176 is disposed vertically below the first end 172 of the first flexible tube 170. In one example, the first and second flexible tubes 170 and 176 comprise nonmagnetic stainless steel tubes each having a bellows section 182. In one construction, the vertically upper end of the second stage 162 of the first cryocooler coldhead 114 contains a condenser 184 to which the first ends 172 and 178 of the first and second flexible tubes 170 and 176 are brought in thermal contact. In one design (not shown), the first housing 132 is a sleeve which also surrounds the first and second stages 160 and 162 wherein the first cryocooler coldhead 114 can be replaced without loss of vacuum, such sleeve arrangement being known to those skilled in the art.

In one example, the first central axis 130 of the first cryocooler coldhead 114 and the first bellows axis 134 of the first bellows 116 are generally coincident. In this example, the first coldhead support 140 has a length and has a lengthwise axis 186. The lengthwise axis 186 of the first coldhead support 140 is generally coincident with the first central axis 130 of the first cryocooler coldhead 114 and the first bellows axis 134 of the first bellows 116.

Figure 3:
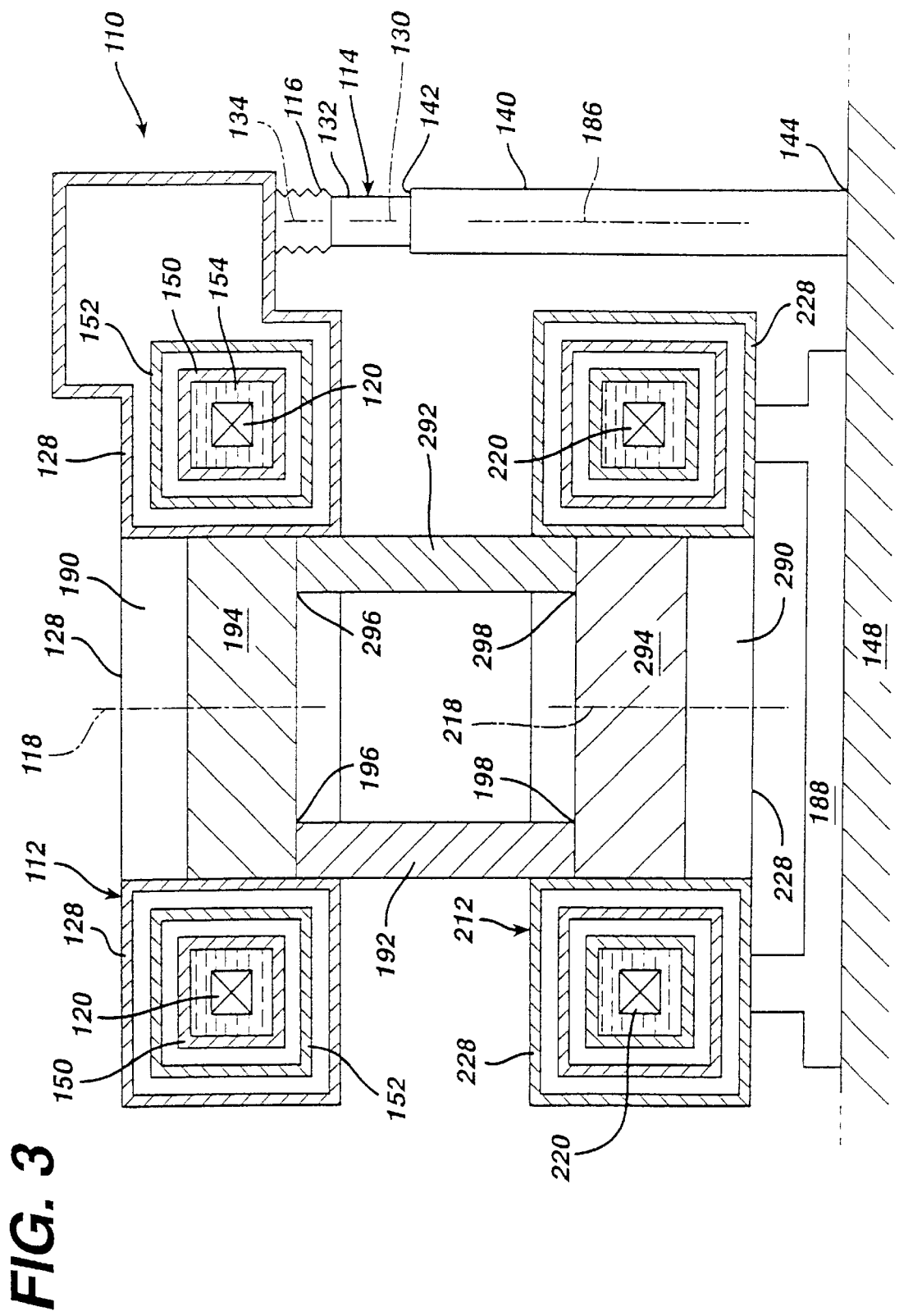
FIG. 3 is a schematic, cross-sectional view of a second embodiment of a magnet of the invention, wherein the magnet is an open magnet which is generally vertically aligned.

In one application, the second vacuum enclosure 228 is supported by a floor mount 188 placed on the floor 148, and the first coldhead support 140 is supported by the floor 148, wherein the first cryocooler coldhead 114 derives no weight-bearing support from the first vacuum enclosure 128 of the first assembly 112 or from the second vacuum enclosure 228 of the second assembly 212 or from the at least one nonmagnetizable support member 192 and 292, as shown in FIG. 3. It is noted that these applications are not limited to a single cryocooler coldhead. For example, if needed, a second cryocooler coldhead (not shown) can be a single-stage cryocooler coldhead having its single stage be in thermal contact with the second thermal shield of the second vacuum enclosure.

Several benefits and advantages are derived from the invention. Applicants conducted an experiment wherein the cryocooler coldhead was vertically aligned, was flexibly attached by a flexible bellows to the vacuum enclosure of a superconductive magnet, and was rigidly attached to the support ceiling of the room by a rigid coldhead support. Applicants found more than a hundred times reduction in vibration of the vacuum enclosure caused by the cryocooler coldhead compared to having the cryocooler coldhead rigidly mounted to the vacuum enclosure. Engineering calculations show improved vibration reduction by having the central axis of the cryocooler coldhead, the first bellows axis, and the lengthwise axis of the rigid coldhead support (which attaches the cryocooler coldhead to the support ceiling or floor) all be generally coincident (and all be generally vertically aligned). Engineering analysis shows improved vibration reduction over a horizontally-aligned cryocooler coldhead. Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation (including "ghosting" in images). It is noted that, in an open magnet, when the support member(s) provide a "clam-shell" support for the assemblies, the superconductive coils of such assemblies are subject to a significant "clam-shell" vibration from the cryocooler coldhead(s) which is likened to the partial closing and opening of a clam shell. It is noted that a "clam-shell" support is provided by having only two support members, especially when the two support members are not diametrically aligned. Such clam-shell support is a very open support providing ease of patient table access to the imaging volume and providing ease of patient positioning within the imaging volume.

It should be noted that additional superconductive main coils, superconductive shielding coils, superconductive correction coils, and magnetizable rings may be present, as is known to the artisan, but such coils and rings have been omitted from the figures for clarity. Likewise, coil forms (if needed) to support the superconductive main coils and spacers to position a thermal shield with respect to a cryogenic vessel and to position a thermal shield with respect to a vacuum enclosure have been omitted from the figures but are well known to those skilled in the art. In an example, the open magnet 110 is a 0.5 or higher Tesla magnet, and the cryocooler coldheads are Gifford McMahon cryocooler coldheads.

Applicants know that, when a cryocooler coldhead is attached to, and receives weight-bearing support from, a vacuum enclosure of an assembly of a magnet, cryocooler-imparted vibration to that assembly, and hence to the magnet, can be reduced by providing a horizontal alignment for the cryocooler coldhead. Applicants also know that cryocooler-imparted vibration to a vertically-aligned open magnet can be reduced by providing the bottom assembly with a skirt floor mount (not shown), instead of conventional foot floor mounts found on horizontally-aligned open magnets, with the skirt being, for example, a vertical extension (with a horizontal radially-outwardly-extending horizontal rim) of the second vacuum enclosure 228 of the second assembly 212. The present invention, the weight-bearing, horizontal attachment of the cryocooler coldhead to an assembly, and the magnet skirt can be used alone, or in any appropriate combination, as can be chosen by the artisan to meet the requirements of a particular magnet design. The stiffness of the support members, the stiffness of the cryocooler coldhead flexible attachment, and the stiffness of the magnet skirt can be chosen by those skilled in the art to reduce cryocooler-imparted vibration to the first and second assemblies 112 and 212 while providing structural support against gravitational and electromagnetic forces.

The foregoing description of several expressions and embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open magnet comprising:

a) a first assembly including:
  (1) a longitudinally-extending and generally-vertically-aligned first axis;
  (2) at least one superconductive main coil generally coaxially aligned with said first axis and carrying a first main electric current in a first direction;
  (3) a first vacuum enclosure enclosing said at least one superconductive main coil of said first assembly and surrounding a first bore; and
  (4) a first magnet pole piece generally coaxially aligned with said first axis and disposed inside said first bore and outside said first vacuum enclosure;

b) a first cryocooler coldhead having a first central axis and a rigid first housing, wherein said first central axis is generally vertically aligned;

c) a first bellows having a first bellows axis and first and second ends, wherein said first bellows axis is generally vertically aligned and said first bellows is flexible along said first bellows axis, wherein said first end of said first bellows is hermetically attached to said first housing of said first cryocooler coldhead, and wherein said second end of said first bellows is hermetically attached to said first vacuum enclosure of said first assembly;

d) a second assembly longitudinally spaced apart from and disposed generally vertically below said first assembly and including:
  1) a longitudinally-extending second axis generally coaxially aligned with said first axis;
  (2) at least one superconductive main coil generally coaxially aligned with said second axis and carrying a second main electric current in said first direction;
  (3) a second vacuum enclosure enclosing said at least one superconductive main coil of said second assembly and surrounding a second bore; and
  (4) a second magnet pole piece generally coaxially aligned with said second axis and disposed inside said second bore and outside said second vacuum enclosure; and e) at least one nonmagnetizable support member having a first end attached to said first magnet pole piece and having a second end attached to said second magnet pole piece.

2. The magnet of claim 1, also including a rigid and generally-vertically-aligned first coldhead support having a first vertical end attached to said first housing of said first cryocooler coldhead and having a second vertical end either attached to a support ceiling or supported by a floor, wherein said first housing of said first cryocooler coldhead derives no weight-bearing support from said first vacuum enclosure of said first assembly or from said second vacuum enclosure of said second assembly or from said at least one nonmagnetizable support member.

3. The magnet of claim 2, wherein said first assembly includes a first cryogenic vessel surrounding said at least one superconductive main coil and a first thermal shield generally surrounding said first cryogenic vessel, wherein said first thermal shield is surrounded by said first vacuum enclosure, and wherein said first cryogenic vessel contains a first cryogenic fluid including a liquid portion and a boiled-off gaseous portion.

4. The magnet of claim 3, wherein said first cryocooler coldhead is a two-stage cryocooler coldhead and includes a first stage and a second stage which is colder than said first stage.

5. The magnet of claim 4, also including a flexible, thermally-conductive strip having a first end in thermal contact with said first stage of said first cryocooler coldhead and having a second end in thermal contact with said first thermal shield of said first assembly.

6. The magnet of claim 5, also including a first flexible tube having a first end in thermal contact with said second stage of said first cryocooler coldhead and having a second end in physical contact with said liquid portion of said first cryogenic fluid.

7. The magnet of claim 6, also including a second flexible tube having a first end in thermal contact with said second stage of said first cryocooler coldhead and having a second end in physical contact with said gaseous portion of said first cryogenic fluid.

8. The magnet of claim 7, wherein said first central axis and said first bellows axis are generally coincident, and wherein said first coldhead support has a length and has a first lengthwise axis which is generally coincident with said first central axis and said first bellows axis.

9. The magnet of claim 2, wherein said first coldhead support has a length and has a first lengthwise axis which is generally coincident with said first central axis and said first bellows axis.

10. The magnet of claim 1, wherein said first central axis and said first bellows axis are generally coincident.

* * * * *